United States Patent [19]

Marchetti, deceased et al.

[11] Patent Number: 4,792,479
[45] Date of Patent: Dec. 20, 1988

[54] PUNCHABLE EPOXY BASED LAMINATING COMPOSITIONS

[75] Inventors: Joseph R. Marchetti, deceased, late of Hempfield Twp., Westmoreland County, Pa., by Laura J. Marchetti, administratrix; Fred E. Hickman, III, Derry, N.H.; Wilbur R. Thomas, Hampton, S.C.

[73] Assignee: Westinghouse Electric Corp., Pittsburgh, Pa.

[21] Appl. No.: 890,591

[22] Filed: Jul. 30, 1986

[51] Int. Cl.⁴ .................. B32B 5/06; B32B 17/10; H05K 1/00
[52] U.S. Cl. .................. 428/236; 428/248; 428/249; 428/251; 428/285; 428/288; 428/290; 428/414; 428/415; 428/416; 428/537.5
[58] Field of Search ........... 428/414, 415, 416, 537.5, 428/236, 245, 251, 248, 249, 285, 288, 290

[56] References Cited
U.S. PATENT DOCUMENTS 3,218,370 11/1965 Fry et al. .................. 428/415 X
3,536,546 10/1970 Melsen et al. .................. 428/415
4,477,512 10/1984 Thomas et al. .................. 428/417 X
4,501,787 2/1985 Marchetti et al. .................. 428/415 X
4,539,253 9/1985 Hirshbuehler et al. .................. 428/248

Primary Examiner—P. C. Ives
Attorney, Agent, or Firm—Joyce L. Morrison; D. P. Cillo

[57] ABSTRACT

Disclosed is a solution of about 2 to about 25 percent by weight based on total solids, of an oligomer having at least two carboxylic acid groups polymerized from an unsaturated fatty acid having at least ten carbon atoms, up to about 20 percent by weight based on total solids of a phenolic resin, an epoxy resin in an amount from about stoichiometric up to about 20 percent excess equivalents of epoxide groups, up to about 2 percent by weight based on total solids of a catalyst and about 10 to about 90 percent by weight based on total solution weight of the solvent. Also disclosed is a prepreg which comprises a substrate impregnated with the solution, dried and cured to the B-stage, and a laminate which comprises a stack of prepregs, pressed under heat and cured to the C-stage.

15 Claims, 1 Drawing Sheet

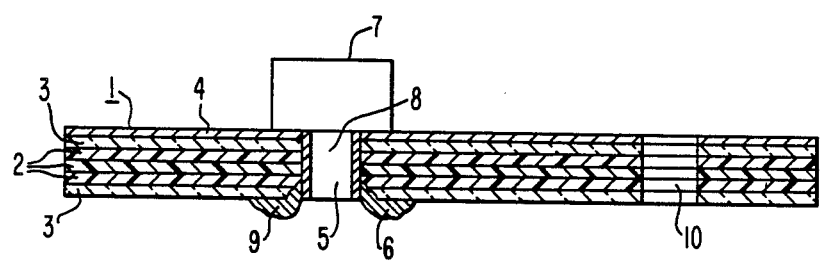

PUNCHABLE EPOXY BASED LAMINATING COMPOSITIONS

BACKGROUND OF THE INVENTION

Copper-clad laminates for use in printed circuit boards were originally drilled to receive components mounted on the board. However, in an effort to reduce costs, drilling has been replaced by punching. In order to punch "clean" holes through the laminates, it is necessary to use special resin compositions in preparing the laminates. These compositions must be sufficiently flexible so that the punch does not fracture the board, yet they must also have the stiffness and other mechanical properties required to hold the components in position, as well as good electrical properties such as a low dielectric constant.

While some laminating compositions have overcome some of the problems encountered in punching laminates, such as a halo effect that occurs around the holes (see U.S. Pat. No. 4,477,512), these compositions have not solved the problem of cratering. Cratering occurs when the punch exits the opposite side of the board and a small amount of board breaks away from around the hole. With some components that are mounted on the board, cratering does not create any problems. However, when a component is mounted on the board in the form of a small tube that passes through the hole, cratering can prevent solder from flowing by capillary action into the tube. As a result, mass soldering by dipping the board into liquid solder cannot be used to mount these components, and the soldering must be done by hand, which is, of course, much more expensive.

SUMMARY OF THE INVENTION

We have discovered that cratering can be greatly reduced or even eliminated if dimers or trimers of fatty acids are used to internally flexibilize epoxy-based laminating resin compositions that are cross-linked with phenolic resins. In addition, we have found that heat reactive phenolic resins (resole resins) can be used in place of the novolac resins previously used. The resins can be made flame retardant by the inclusion of halogenated phenols or by using halogenated epoxies.

The varnishes of this invention can be formulated rapidly, and can be halogenated in situ. The prepregs prepared from the varnishes of this invention are stable in storage and are relatively insensitive to moisture. The resulting laminates meet or exceed current NEMA requirements for FR-3 type laminates and are processable under current production schemes. While the laminates of this invention have significantly better punching characteristics than prior laminates, they have no significant loss of mechanical properties.

DESCRIPTION OF THE INVENTION

The accompanying drawing is a side view in section of a laminate.

In the drawing, a laminate 1 consists of three paper based prepregs 2, two glass based prepregs 3, and copper cladding 4. A hole 5, punched through the laminate, illustrates the formation of a crater 6 where the punch exited the laminate. Component 7 mounted on the laminate has tube 8 which passes through the hole 5. Solder 9, applied to the base of the laminate, is prevented by crater 6 from flowing into tube 8. A second hole 10 illustrates a "clean" hole where no crater formed where the punch exited the laminate.

The laminating resin compositions of this invention include an oligomerized fatty acid plasticizer and cross-linker, an epoxy resin, a phenolic resin, a catalyst, and a solvent. The fatty acid oligomer is prepared from an unsaturated fatty acid having at least 10 carbon atoms, and preferably about 20 to about 30 carbon atoms. Fatty acids are aliphatic monocarboxylic acids which can be saturated or unsaturated. (Esters of fatty acids cannot be used in the process of this invention as they will not react with the other components of the resin composition). Examples of unsaturated fatty acids include, obtusilic, caproleic, 10-undecylenic, lauroleic, physeteric, myristoleic, palmitoleic, petroselinic, petroselaidic, oleic, elaidic, vaccenic, gadoleic, cetoleic, erucic, brassidic, selacholeic, ximenic, lumequoic, sorbic, linoleic, linolelaidic, hiragonic, α-eleostearic, β-eleostearic, punicic, linolenic, elaidolinolenic, psuedoeleosteraic, moroctic, α-parinaric, β-parinaric, arachidonic, clupanodonic, nisinic, propiolic, tetrolic, 4-pentynoic, dehydroundecylenic, tariric, stearolic, behenolic, isanic, ricinoleic, and licanic. The fatty acids used in the resin compositions of this invention must be oligomerized, which means that they must be dimerized, trimerized, or polymerized so that they have at least two carboxylic acid groups. The fatty acids are more preferably dimerized or trimerized (i.e., they have two or three carboxylic acid groups) as these compounds are readily available. Dimers will not gel the epoxy resin and therefore an epoxy catalyst is required if a dimer is used. Trimers, however, will gel the epoxy resin, and therefore an epoxy catalyst is not needed if a trimer is used, although it may be advantageous to include one anyway.

Any type of epoxy resin can be used in the resin compositions of this invention, including cycloaliphatic epoxy resins, hydantoin epoxy resins, novolac epoxy resins, diglycidyl ethers bisphenol-A, diglycidyl ethers of bisphenol-S, prehalogenated epoxy resins, and in situ halogenated epoxy resins. If it is desired to make the laminate flame retardant, the epoxy should either be prehalogenated or in situ halogenated. About 10 to about 30 percent by weight, based on total halogenated epoxy weight, consists of halogen atoms. Bromine is the preferred halogen as it is readily available. In situ bromination can be accomplished using an epoxy resin and a brominated phenol such as tetrabrominated bisphenol-A (TBBPA).

The resin compositions of this invention include a phenolic resin which acts as a curing agent. (We have found that dicyandiamide cannot be used to cure a resin composition that is used to impregnate paper because a reaction seems to occur between the dicyandiamide and the paper.) The phenolic resin is the reaction product of a phenol, such as bisphenol-A, bisphenol-S, or phenol, with formaldehyde, and may be a novolac, which is thermoplastic, or a resole, which is heat reactive. Novolac resins have the idealized general formula:

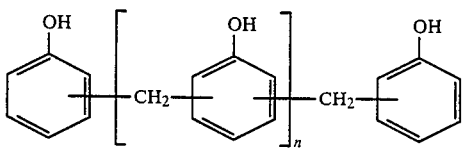

Resole phenolic resins have the idealized general formula:

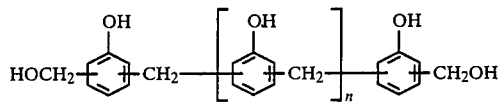

Novolac phenolic resins are produced if the reaction conditions are acidic, and resole phenolic resins are produced if the reaction conditions are basic. Novolac phenolic resins are preferred as they are more stable and it is easier to control the crosslink density of the resin formulation. However, if the laminate is to be punched hot, it may be desirable to use a resole phenolic resin instead of a novolac phenolic resin. In a novolac resin, the hydroxyl groups on the phenol react with the epoxy groups to crosslink the epoxy. In a resole phenolic resin, the hydroxyl groups also react with the epoxy, but the $CH_2OH$ groups on the resole react with other $CH_2OH$ groups, with the carboxyl groups on the fatty acid, and with the hydroxyl groups on the tetrabrominated bisphenol-A if it is present.

A catalyst for the epoxy resin is also preferably included in the composition. Suitable catalysts include 2-methylimidazole, benzyldimethylamine (BDMA), quaternary ammonium salts of strong acids and inorganic bases, triphenylphosphine, stannic chloride, and stannic octoate. The preferred catalyst is a mixture of about 30 to about 100 percent by weight, based on total catalyst weight, 2-methylimidazole and about 0 to about 70 percent of stannic octoate, triphenylphosphine, or mixtures thereof, because it promotes incorporation of the fatty acid dimer or trimer into the backbone of the epoxy resin during treating and lamination.

The resin composition of this invention also includes an organic solvent for the oligomerized fatty acid, the epoxy resin, and the phenolic acetone resin. Suitable organic solvents include alcohols such as isopropanol, propylene glycol, and methylcellosolve, and ketones such as methylisobutyl ketone, and methylethyl ketone. Hydrocarbons such as toluene and xylene can also be used as solvents, but it is desirable to have some oxygenated solvent present because of nonsolubility of the novolac in hydrocarbon solvents. The preferred solvent is a mixture of about 30 to 100 percent by weight, based on total solvent weight, of acetone, and about 0 to about 70 percent by weight, based on total solvent weight, of toluene.

The resin composition may also include various optional ingredients such as fillers. Suitable fillers include alumina trihydrate, calcium carbonate, antimony trioxide, cashew nut flour, and walnut flour.

The composition is prepared by mixing the components together in any order. A suitable composition includes about 2 to about 25 weight percent, based on total resin solids, of the oligomerized fatty acid. If less oligomerized fatty acid is used, cratering may occur and if more oligomerized fatty acid is used, the laminate may be too soft and have poor punching characteristics. If the oligomerized fatty acid is a dimer, the amount of phenolic resin in the resin composition should be about 0.5 to about 20 percent by weight, based on total resin solids. If less phenolic resin is used, the epoxy will be insufficiently crosslinked and the laminate may have poor thermal properties, and if more phenolic resin is used, the laminate may be too brittle. If the oligomerized fatty acid is a trimer or a polymer, the amount of phenolic resin should be about 0 to about 20 percent by weight, based on total resin solids. The amount of catalyst can be as low as zero if the oligomerized fatty acid is a trimer or a polymer, or it can be as high as 2 percent by weight, based on total resin solids. If more catalyst is used, the resin composition may gel too rapidly and it may be difficult to stop the crosslinking at the B-stage. The composition should include about 10 to about 90 percent by weight, based on total composition weight, of the solvent. Less solvent results in poor penetration of the substrate and more solvent is generally unnecessary. A preferred composition according to this invention includes about 10 to about 20 percent by weight of the oligomerized fatty acid, about 5 to about 7 percent by weight of the phenolic resin if a dimer is used, and about 0 to about 7 percent by weight of the phenolic resin if a trimer or polymer of a fatty acid is used, about 0.2 to about 3 percent of the catalyst, and about 25 to about 35 percent solvent.

The amount of epoxy resin in the resin composition is selected so that the composition has about 0 to about 20 weight percent excess equivalents of epoxide groups. (The weight percent of excess epoxide equivalents is determined by taking the total epoxide equivalents that are present and subtracting the total equivalents of epoxide reactive ingredients, and dividing that number by the total epoxide equivalents, multiplied by 100.) If more than 20 weight percent excess equivalents of epoxide groups are present, the laminate will be too plasticized and will have poor chemical resistance, and if fewer equivalents of epoxide groups are present the laminate will lack mechanical strength. Preferably, the resin composition includes about 5 to about 15 percent by weight excess equivalents of epoxide groups.

A prepreg is prepared by dipping a substrate into the resin composition or otherwise applying the resin composition to a porous substrate. Suitable substrates includes cotton linters, wood-pulp paper, rice paper, poly(p-phenylene terephthalamide) ("Kevlar") paper, non-woven fiberglass matte or cloth, felt, canvas, etc. Paper substrates are preferred because the resin composition of this invention will cure over paper and many other resin compositions will not. Once the substrate has been impregnated with the resin composition, the solvent is evaporated and the resin is cured to the B-stage. This can generally be accomplished by heating, for example, at about 120° to about 180° C. for about 10 to about 5 minutes.

A laminate is prepared by stacking plies of prepregs and heating them under pressure. A preferred laminate includes three plies of prepregs made of 20 mil paper as a substrate, which forms the core of the laminate, with a conventional fiberglass FR-4 prepreg on either side. Another preferred laminate uses four plies of prepregs which results in an FR-3 board. Copper foil is applied to the laminate by adhesives, as is known in the art, unless the outer surface is fiberglass, in which case the resin in the prepreg will also bond the copper insert. The copper can also be applied to the laminate by an additive process as is known in the art. Holes can then be made in the laminate by drilling or punching and electronic components can be applied to its surface.

The following examples further illustrate this invention.

EXAMPLES

Resin compositions were formulated to contain 10% excess epoxide on an equivalent basis. A 5 gallon lined steel container fitted with an air driven propeller type agitator was charged with an appropriate amount of methyl cellosolve. With the agitator running a phenolic novolac resin with a low ionic content and a phenolic hydroxyl equivalent weight of 107 GM/OH EQUIV supplied by the Union Carbide Corporation at 100% solids as free flowing flakes under the trade designation "BRWE 5833," and a homogeneous, liquid, saturated fatty acid mixture composed of 80% $C_{54}$ trimer acids ($M_w \sim 845$) and 20% $C_{36}$ ($M_w \sim 565$) dimer acids, and having an average carboxyl equivalent weight of 305.7 GM/COOH EQUIV, sold by Energy Industries under the trade designation "EMPOL 1040," were charged into the methyl cellosolve and dissolved. The diglycidyl ether of 2,2-bis(4-hydroxyphenyl)propane (supplied by Shell with proprietary phosphonium halide catalyst at 96.5% solids in xylene as "Epon 829") and TBBPA were added to the solution and it was stirred at medium speed until it was clear and uniform. The BDMA catalyst was then added last.

Solids basis compositional data together with varnish properties and laminate Tg for this varnish series is presented in the following table.

| Laminate Number | A | B | C | D | E | F |
|---|---|---|---|---|---|---|
| WT % Epon 829 | 42.13 | 44.18 | 46.34 | 48.50 | 50.64 | 52.80 |
| WT % TBBPA | 33.04 | 33.04 | 33.04 | 33.03 | 33.04 | 33.04 |
| WT % "Empol 1040" | 24.38 | 20.00 | 15.00 | 10.00 | 5.00 | — |
| WT % BRWE 5833 | — | 2.50 | 5.34 | 8.18 | 11.04 | 13.88 |
| WT % BDMA | 0.28 | 0.28 | 0.28 | 0.28 | 0.28 | 0.28 |
| Set-Time, min | 28.7 | 25.7 | 23.1 | 19.1 | 16.6 | 14.1 |
| Viscosity, CPS | 98.0 | 108.0 | 110.0 | 130.0 | 147.0 | 190.0 |
| Laminate Tg, °C.(DSC) | <70.0 | 73.4 | 77.7 | 91.0 | 101.0 | 130.0 |

Style 7628 glass cloth was impregnated with the varnishes using standard laboratory impregnating procedures. Although the compositions were designed primarily for paper applications, glass cloth was utilized for laboratory work because of the difficulties involved in preparing good quality paper laminates by hand impregnating methods. B-staging in each case was accomplished at 150° C. for six minutes. The resulting prepregs were laminated 1 hour at 180° C. under 800 PSI pressure. Cool down was accomplished under pressure.

As a result of this preliminary work and because of laminate Tg, Composition C was chosen for scale-up into a pilot treater for production of paper based prepreg material.

The following table gives the composition and properties of a scaled up version of Composition C.

| | |
|---|---|
| WT % "Epon 829" | 46.38 |
| WT % TBBPA | 33.04 |
| WT % "Empol 1040" | 15.00 |
| WT % "BRWE 5833" | 5.34 |
| WT % BDMA | 0.28 |
| WT % Bromine* | 20.0 |
| Specific Gravity | 1.187 |
| Set-Time, min. | 25'10" |
| Viscosity, cps | 107 |

*Based On Resin Solids

A horizontal pilot scale treater was utilized to impregnate the varnish into 20 mil cotton linter paper pretreated with a low molecular weight, heat reactive phenolic resole resin sold by Reichold Chemicals Inc. as "Polyphen." Treating conditions together with prepreg properties are presented in the following table.

| | |
|---|---|
| Wet Zone Temp., °F. | 330 |
| Dry Zone Temp., °F. | 325 |
| Treater Speed Setting | L5 |
| Squeeze Roll Setting, in. | 0.022 |
| Prepreg Resin Content,* wt % | 55 |
| Prepreg Greenness, % | 18.8 |

*Average of Left and Right Sides

Four-ply 12"×18" single sided, copper clad laminates were prepared from the prepregs under standard FR-3 laminating conditions using 1 ounce (1.4 mil) copper foil with an adhesive backing derived from polyvinyl butyral. The experimental laminates were tested under current NEMA (National Electrical Manufacturers Association) test methods.

Property data for the laminates and a current commercial FR-3 laminates are compared to NEMA FR-3 specifications in the following table.

| Laminate Grade | This Invention | Commercial | NEMA FR-3*** |
|---|---|---|---|
| Varnish Cost, $/Solid Lb. | 1.16 | 1.57 | — |
| Solder Float, Sec. @ 500° F. | 60+ | 30 | 5 |
| Solder Float, Sec. @ 550° F. | 91 | — | — |
| Peel Strength*, Grain Direction, lb/in. | 10.6 | — | 8 |
| Peel Strength*, Cross Grain, lb/in. | 10.4 | — | — |
| Peel Strength**, Grain Direction, lb/in. | 10.4 | 10 | 8 |
| Peel Strength**, Cross Grain, lb/in. | 10.0 | — | — |
| Glass Transition Temp., Tg, °C. | 73.5 | — | — |
| Decomposition Temperature, TD, °C. | 280 | — | — |
| Water Absorption (%), D-24/23 | 0.37 | 0.35 | 0.65 |
| Dissipation Factor (1 Megahertz) D-24/23 | 0.038 | 0.035 | 0.040 |
| Dielectric Constant (1 Megahertz) D-24/23 | 4.5 | 4.3 | 4.8 |
| Dielectric Breakdown, kV, D-48/50 | >70 | >60 | >30 |
| Surface Resistance, Megohms | $1.65 \times 10^5$ | $5 \times 10^4$ | $1 \times 10^4$ |
| Volume Resistivity, Megohm-cm | $9.5 \times 10^6$ | $1 \times 10^8$ | $1 \times 10^5$ |
| Flexural Strength, With Grain, psi | 23,540 | 30,000 | 20,000 |
| Flexural Strength, Cross Grain, | 21,115 | — | 16,000 |

| Laminate Grade | This Invention | Commercial | NEMA FR-3*** |
|---|---|---|---|
| psi | | | |

*1 oz. copper.
**1 oz. copper after 20 sec. 500° F. solder float.
***Required NEMA FR-3 specifications.

It is apparent from the data that the laminates of this invention meet or exceed current NEMA specifications for FR-3.

These experiments showed that as the "Empol 1040" concentration increased, the laminate Tg decreased, which indicates a greater degree of internal plasticization.

We claim:

1. A prepreg comprising a porous substrate of paper, glass and mixtures thereof, impregnated with a solution, then dried and cured to the B-stage, where said solution comprises:
   (A) about 2 to about 25% by weight, based on total solids, of an oligomer having at least two carboxylic acid groups, polymerized from an unsaturated fatty acid having at least 10 carbon atoms;
   (B) up to about 20% by weight, based on total solids, phenolic resin;
   (C) epoxy resin in an amount from about 0 to about 20% excess equivalents of epoxide groups;
   (D) up to about 2% by weight, based on total solids, of a catalyst; and
   (E) about 10 to about 90% by weight, based on total solution weight, of an organic solvent.

2. A prepreg according to claim 1 wherein said oligomer has two or three carboxylic acid groups.

3. A prepreg according to claim 1 wherein said epoxy is prebrominated.

4. A prepreg according to claim 1 which includes about 10 to about 30% by weight, based on said epoxy resin weight, of tetrabrominated bisphenol-A.

5. A prepreg according to claim 1 wherein said phenolic resin is a novolac resin.

6. A prepreg according to claim 1 wherein said phenolic resin is a resole resin.

7. A prepreg according to claim 1 wherein said catalyst is a mixture of about 30 to about 100% by weight, based on total catalyst weight, of 2-methylimidazole, and about 0 to about 70% by weight of a compound selected from the group consisting of stannous octoate, triphenylphosphine, and mixtures thereof.

8. A prepreg according to claim 1 wherein said solvent is a mixture of about 30 to about 100% by weight, based on total solvent weight, of acetone, and about 0 to about 70% by weight toluene.

9. A laminate comprising a stack of prepregs according to claim 1, pressed under heat and cured to the C-stage.

10. A laminate according to claim 9 wherein said stack comprises 4 to 6 prepregs, and said substrate is 20 mil paper.

11. A laminate according to claim 10 wherein copper foil is bonded to at least one surface of said stack.

12. A laminate according to claim 9 wherein said stack comprises three paper based prepregs sandwiched between two fiberglass based prepregs.

13. A laminate according to claim 12 wherein copper foil is bonded to at least one surface of said stack.

14. A prepreg comprising a porous substrate of paper, glass and mixtures thereof impregnated with a solution, then dried and cured to the B-stage, where said solution comprises:
   (A) about 10 to about 20% by weight, based on total solids, of a dimer or trimer of a $C_{20}$ to $C_{30}$ unsaturated fatty acid;
   (B) about 3 to about 10% by weight, based on total solids, of a novolac phenolic resin;
   (C) an epoxy resin selected from the group consisting of prebrominated epoxy resins and epoxy resins containing about 10 to about 30% by weight, based on epoxy resin weight, of tetrabrominated bisphenol-A, in an amount about 5 to about 15% equivalents in excess of stoichiometric;
   (D) about 0.2 to about 0.3% by weight, based on total solids, of a catalyst of about 30 to about 100% by weight, based on total catalyst weight, of 2-methylimidazole, and about 0 to about 70% by weight of a compound selected from the group consisting of stannous octoate, triphenylphosphine, and mixtures thereof; and
   (E) about 25 to about 35% by weight, based on total solution weight, of a solvent of about 30 to about 100% by weight, based on solvent weight, of acetone, and about 0 to about 70% by weight toluene.

15. A laminate comprising a stack of prepregs according to claim 14, pressed under heat and cured to the C-stage.

* * * * *